United States Patent [19]
Wei et al.

[11] Patent Number: 4,729,005
[45] Date of Patent: Mar. 1, 1988

[54] METHOD AND APPARATUS FOR IMPROVED METAL-INSULATOR-SEMICONDUCTOR DEVICE OPERATION

[75] Inventors: Ching-Yeu Wei; Henry H. Woodbury, both of Schenectady, N.Y.

[73] Assignee: General Electric Company, Schenectady, N.Y.

[21] Appl. No.: 891,058

[22] Filed: Jul. 31, 1986

Related U.S. Application Data

[63] Continuation of Ser. No. 728,431, Apr. 29, 1985, abandoned, which is a continuation of Ser. No. 400,172, Jul. 20, 1982, abandoned.

[51] Int. Cl.$^4$ .................. H01L 29/78; H01L 27/14; H01L 29/40; H01L 29/34
[52] U.S. Cl. .......................... 357/30; 357/24; 357/31; 357/32; 357/53; 357/54; 357/52
[58] Field of Search ............. 357/24 LR, 30–32, 357/52–54; 250/332; 358/113

[56] References Cited

U.S. PATENT DOCUMENTS

| | | | |
|---|---|---|---|
| 3,805,062 | 4/1974 | Michoni et al. | 357/24 LR |
| 3,983,395 | 9/1976 | Kim | 357/30 |
| 4,011,442 | 3/1977 | Engeler | 250/21 N |
| 4,327,291 | 4/1982 | Chapman et al. | 357/30 |
| 4,360,732 | 11/1982 | Chapman | 357/30 |
| 4,380,056 | 4/1983 | Parrish et al. | 357/24 LR |
| 4,429,330 | 1/1984 | Chapman | 357/24 LR |

OTHER PUBLICATIONS

A. K. Sood et al "Improved Performance of Implanted n$^+$-p Hg$_{1-x}$Cd$_x$Te Photodiodes Using Insulated Field Plates", *IEEE Electron Review Letters*, vol. ELD-1 (1980) pp. 12–14.

G. G. Jambottzar, "Spaced Field Plate for Increasing Planar Junction Breakdown Voltage" *IBM Technical Disclosure Bulletin* vol. 19 (1976) pp. 478–479.

*Primary Examiner*—J. Carroll
*Attorney, Agent, or Firm*—Robert Ochis; James C. Davis, Jr.; Marvin Snyder

[57] ABSTRACT

An improved method and apparatus for reducing edge field enhancement in semiconductor devices such as metal-insulator-semiconductor devices is disclosed. The method comprises the step of biasing a buffer gate which overlies an insulation layer and an area of a substrate in which it is desired to reduce the edge field enhancement at a voltage exceeding the flatband voltage so that a buffered zone is created in the substrate. The apparatus consists of a substrate, a plurality of insulating layers overlying the substrate, at least one gate electrode formed on one of the insulating layers and a buffer gate formed on a second of the insulating layers. When the gate electrode is biased so that a potential well is formed in the substrate, the buffer gate is simultaneously biased so that a buffered zone which adjoins the potential well is formed. This buffered zone results in a decrease in the edge field enhancement observed at the edge of the potential well below the gate electrode and allows the apparatus of the invention to operate in an improved fashion. The method and apparatus of the invention may be incorporated into imaging systems, such as infrared imaging systems, with increased dynamic range.

41 Claims, 11 Drawing Figures

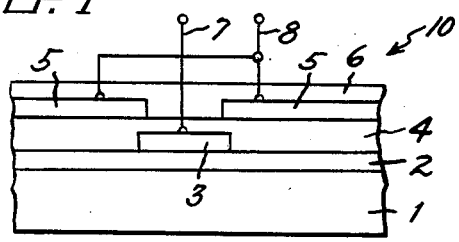
PRIOR ART FIG. 1
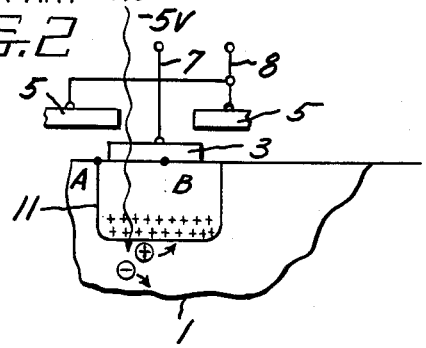
PRIOR ART FIG. 2
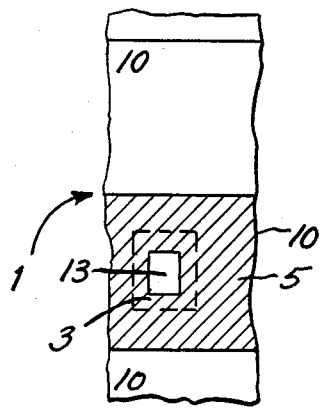
PRIOR ART FIG. 3
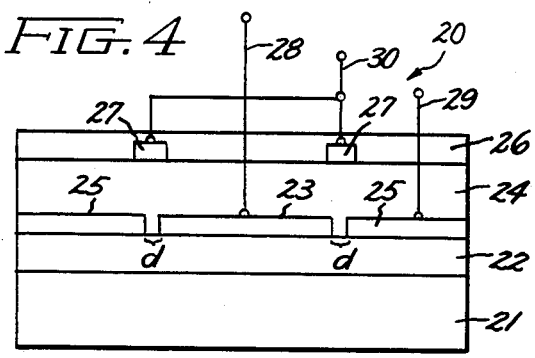
FIG. 4
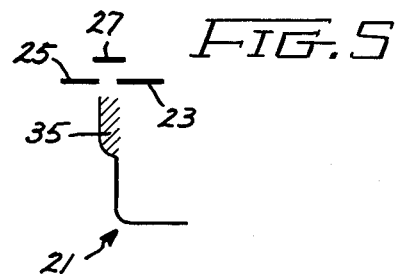
FIG. 5
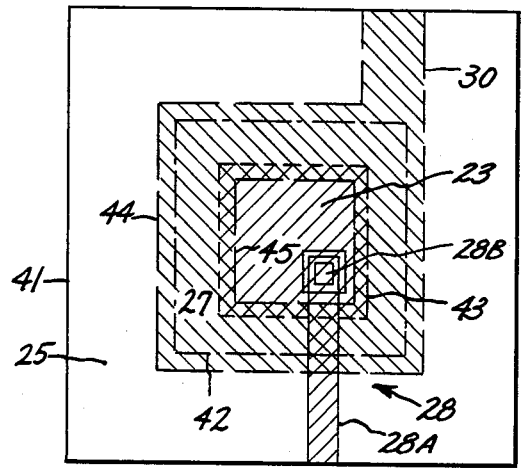
FIG. 6
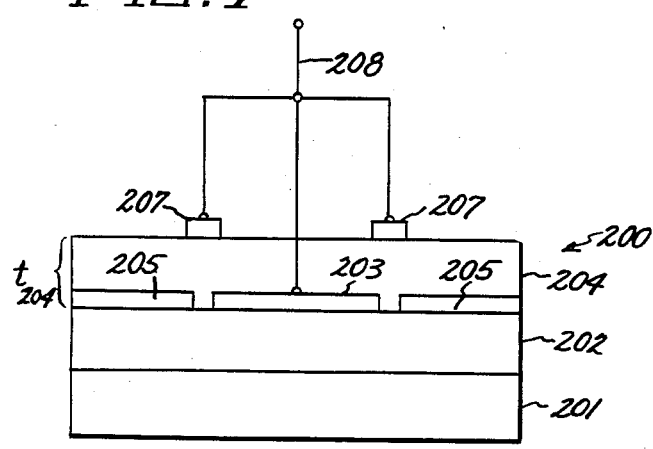
FIG. 7
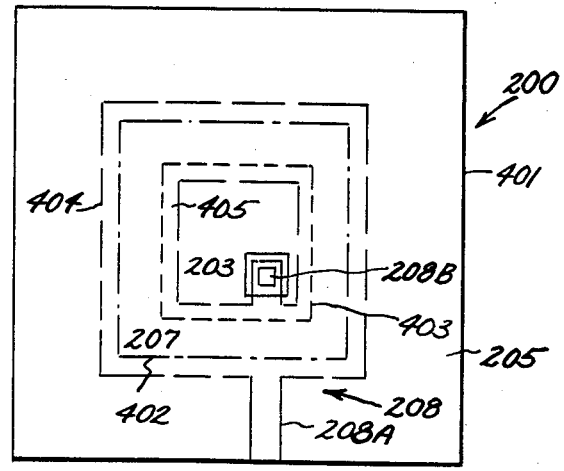
FIG. 8

METHOD AND APPARATUS FOR IMPROVED METAL-INSULATOR-SEMICONDUCTOR DEVICE OPERATION

This application is a continuation of application Ser. No. 728,431, filed Apr. 29, 1985, which is a continuation of application Ser. No. 400,172, filed July 20, 1982, both abandoned.

FIELD OF THE INVENTION

The present invention relates generally to a method and apparatus for reducing edge field enhancement and increasing the maximum injection voltage in metal-insulator-semiconductor (MIS) devices and relates particularly to improved MIS charge injection devices (CIDs) fabricated from narrow band gap semiconductor material.

BACKGROUND OF THE INVENTION

Various radiation sensing and infrared imaging devices and systems are known in the art. Such systems can be constructed using arrays of MIS devices for sensing incident radiation. See, for example, U.S. Pat. Nos. 3,805,062 and 3,983,395 assigned to the assignee of the present invention and U.S. Pat. No. 4,327,291. In systems based upon CIDs, it is necessary to isolate each detection center in the array from the other detection centers of the array. Typically each detection center is isolated from its nearest neighbors by a field plate which surrounds the detection center and provides a channel stop. This field plate is normally biased so that the substrate surface beneath it is in accumulation. In this context, an edge field enhancement effect which will be discussed below has been seen to be a limiting factor in extending the dynamic range of many infrared imaging systems.

It is well known that the field produced at an edge or a corner of an electrode is much higher than that produced at a planar surface portion of the same electrode which is remote from such edges or corners. In an MIS structure, the increased edge field at the edge of a biased electrode or gate penetrates through the insulating layer into the semiconductor substrate resulting in an edge field enhancement effect at the edge of the potential well formed in the portion of the substrate beneath the MIS electrode. This edge field enhancement occuring in the portion of the substrate underlying the edge of the electrode is exacerbated when a field plate surrounding the electrode is biased so that the substrate surface beneath the field plate is in accumulation. The edge field enhancement tends to produce a sharply increased leakage current at the well edge which likely occurs as a result of band-to-band tunneling. The increased leakage current partially fills the potential well with unacceptable noise. To prevent this introduction of noise, the amplitude of the read out or injection voltage pulses applied to the electrode of an MIS device which is part of an imaging system must be significantly reduced from that amplitude which theoretically could be applied in the absence of the edge field enhancement effect. This limitation on the injection voltage limits the well capacity and the maximum charge which can be read out of the MIS device.

In order to improve the dynamic range of many presently known imaging systems employing MIS devices, it is desirable to substantially eliminate any leakage current resulting from the edge field enhancement effect so that an increased injection voltage can be applied without an unacceptable increase in noise charge. Since infrared sensors must be able to function over a wide dynamic range and resolve signals including a high level of background noise, attaining an improved dynamic range and a high well capacity is particularly important for such sensors. Further, infrared sensing devices are often constructed using narrow band gap semiconductor materials, such as indium antimonide (InSb) or mercury cadmium telluride (HgCdTe), which intrinsically have a lower breakdown voltage than wider band gap materials such as silicon (Si). Thus, the problem of achieving a reduced edge field enhancement and a high well capacity is compounded for many infrared detecting systems and is a limiting factor in the further development of many such systems.

Various techniques have been developed in attempts to reduce the edge field enhancement effect. U.S. Pat. No. 4,327,291 applies the well known technique for minimizing electric field problems at sharp corners by eliminating the sharp corners. U.S. Pat. No. 4,327,291 also seeks to minimize electric field problems by adjusting the positioning of the field plate and gate electrodes. A further attempt to reduce edge field enhancement involves adjusting the contour of a gate electrode so that it is nonplanar. While these various geometrical adjustments may result in a small increase in well capacity and a slight edge field decrease, such adjustments may add complexity and cost to the fabrication process or even degrade other pertinent performance characteristics such as lag or crosstalk.

A further technique for reducing the edge field enhancement problem is to construct an MIS device, such as an MIS capacitor, with a field plate which surrounds the MIS electrode and to bias the field plate up to the flatband voltage, the voltage at which depletion is about to begin in the semiconductor surface beneath the field plate. By so biasing the field plate, the bias voltage which can be applied to the MIS electrode can be increased somewhat. However, additional increase cannot be achieved by further increasing the bias on the field plate without defeating the purpose of the field plate because once the flatband voltage is exceeded, depletion or inversion begins and the level of isolation provided by the field plate rapidly decreases and becomes nominal as surface conduction begins. Consequently, the technique of biasing the field plate may only be used to achieve a small reduction in the edge field enhancement problem.

Accordingly, it is an object of this invention to provide method and apparatus suitable for achieving infrared imaging systems with improved dynamic range.

Another object is to provide MIS and CID devices having edge field enhancement which is significantly reduced from that observed with devices as described above.

Another object is to provide MIS and CID devices having an increased maximum injection voltage and having an increased maximum charge which can be read out therefrom.

Another object is to achieve the above objects with a device which can be simply and inexpensively fabricated using planar fabrication techniques.

These and other objects will be apparent from a consideration of the following detailed description and the accompanying claims.

SUMMARY OF THE INVENTION

The present invention provides a novel method and apparatus for significantly reducing the edge field enhancement and increasing the well capacity of MIS devices. The method comprises the steps of forming a buffer gate above the portion of the substrate where it is desired to reduce the edge field and biasing the buffer gate at a voltage exceeding the flatband voltage to create a buffered zone in the substrate beneath the buffer gate. The improved apparatus consists of a device for storing signal charge having at least one MIS electrode or gate which is typically fabricated on one of a purality of insulating layers supported by a substrate and at least one buffer gate spaced from the gate for which the edge field is to be reduced by an insulating layer. In several embodiments, the device will also include a field plate coplanar with the gate and spaced therefrom. The buffer gate preferably overlies and overlaps the gate and may overlie and overlap the field plate where one is used. The buffer gate is biased so as to minimize or substantially decrease the edge field enhancement effect by providing a step down in potential in a buffered zone in the substrate beneath the buffer gate. In a preferred embodiment, the thicknesses of the insulating layer or layers between the substrate and the gate and the substrate and the buffer gate are established so that a single biasing potential may be applied to both the gate and the buffer gate. The area of the buffer gate is made small relative to the area of the gate to be buffered so that substantially all signal charge will be stored beneath the gate electrode. The present invention lends itself to easy fabrication using planar fabrication techniques.

The invention will be more fully described in the drawings and by the detailed description which follow. It should be noted that the drawings are not drawn to scale.

BRIEF DESCRIPTION OF THE DRAWINGS

FIG. 1 is a cross-sectional side view of a prior art MIS capacitor with its field plate spaced from and partially overlying and overlapping its gate electrode;

FIG. 2 schematically depicts a cutout portion of the MIS capacitor of FIG. 1;

FIG. 3 is a top view of the capacitor of FIG. 1 and illustrates schematically how the capacitor may be part of a linear array of similar capacitors all fabricated on the same substrate;

FIG. 4 is a cross-sectional side view of a first embodiment of an MIS capacitor according to the present invention;

FIG. 5 schematically depicts the left half of the MIS capacitor of FIG. 4 and potential wells formed in the capacitor's substrate when biasing potential is applied to its gate and its buffer gate;

FIG. 6 is a top view of the capacitor of FIG. 4;

FIG. 7 is a cross-sectional side view of a second embodiment of an MIS capacitor according to the present invention;

FIG. 8 is a top view of the MIS capacitor of FIG. 7;

DESCRIPTION OF THE INVENTION

Figure 9:
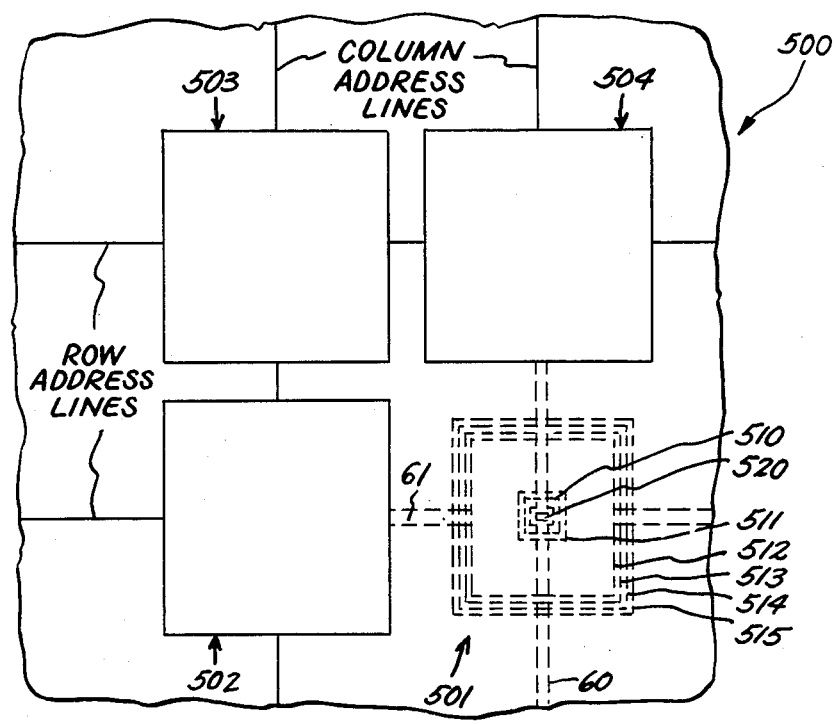
FIG. 9 is a top view of a portion of a CID array and illustrates schematically the connection of an array of picture elements according to the present invention.

In order to better understand the functioning of the present invention, it is first useful to understand in broad terms the functioning of a known MIS device. FIG. 1 shows a cross-section of an MIS capacitor 10 having a substrate 1 of semiconductor material, a first insulating layer 2 overlying the substrate 1, a transparent gate electrode or gate 3 located on the upper surface of insulating layer 2, a second insulating layer 4 overlying the gate 3 and the first insulating layer 2, and a field plate 5 located on the upper surface of the second insulating layer 4 and overlapping and extending around the projection of the perimeter of gate 3 into the same level as that of field plate 5. Field plate 5 is illustrated by the cross-hatched region 5 in FIG. 3. Capacitor 10 also includes a third insulating layer 6 overlying the field plate 5 and the second insulating layer 4, a gate address line 7 which is shown schematically and which connects the gate 3 to a terminal to which bias voltage may be applied, and field plate address line 8 also shown schematically which connects the field plate 5 to a terminal to which bias voltage may be applied. For the purposes of discussion, it will be assumed that substrate 1 is n-type silicon (Si), that the insulating layers 2, 4 and 6 are silicon dioxide ($SiO_2$) and that gate 3 and field plate 5 are aluminum (Al). It will further be assumed that MIS capacitor 10 functions ideally. See Sze, Physics of Semiconductor Devices, 2d Ed. 1981, pp. 362–366 and column 2, lines 29 through 64 of U.S. Pat. No. 3,983,395 assigned to the assignee of the present invention for further details of how MIS devices function.

When a bias is applied to gate address line 7 of MIS capacitor 10, basically three states may exist at the surface of substrate 1. When a positive voltage is applied accumulation occurs. Accumulation refers to the accumulation of majority carriers (here electrons as it has been assumed that the substrate is n-type material) near the surface of the n-type substrate 1 underlying the gate 3. When a small negative voltage is applied, depletion occurs as the majority carriers (electrons) migrate away from the substrate surface and a region depleted of majority carriers forms. When a larger negative voltage is applied, inversion results as the number of minority carriers exceeds the number of majority carriers at the substrate surface and the surface is inverted.

FIG. 2 serves as a basis for discussing what happens when a bias voltage of $-5$ V is suddenly applied to gate address line 7 of capacitor 10. Note, for the sake of simplicity, insulating layers 2, 4 and 6 are not shown in FIG. 2. First, depletion of the substrate surface occurs as discussed above. One way of visualizing what happens at the substrate surface is to imagine that a potential well 11 forms beneath the gate 3. It is noted that the potential well 11 and the charge filling it occurs at the surface of the substrate 1. The drawing of a "well" with exaggerated physical dimension is in accordance with custom for visual convenience. As time passes, incident radiation hr directed as shown passing through transparent gate electrode 3 causes the formation of electron ($-$) and hole ($+$) pairs in the vicinity of the potential well 11 and the holes migrate to the potential well. The accumulation of the individual charges of the collected holes begins to fill up the well 11. The magnitude of the stored charge in well 11 is indicative of the integrated magnitude of the incident radiation. FIG. 2 illustrates well 11 at a time after −5 V has been applied to gate 3 and well 11 is partially filled with stored charge. If the bias voltage is then removed from the gate address line 7, the stored charge is injected into the substrate 1. This injection can be monitored in order to gain a measure of the integrated magnitude of the incident radiation.

The techniques for connecting a plurality of MIS devices such as capacitors 10 into an array system and for reading out the charge stored in the individual MIS devices so that the array system can suitably serve as the basis of an imaging system are known. See, for example, U.S. Pat. No. 3,805,062 assigned to the assignee of the present invention. A means of isolating individual MIS devices or a field plate such as field plate 5 becomes important in just such situations as an array where a plurality of devices are all closely located on a common substrate.

FIG. 3 schematically shows the single capacitor 10 of FIG. 1 as part of a linear array of capacitors 10 on the common substrate 1. The single capacitor 10 is shown in detail, with its gate 3 being the area within the dashed line and its field plate 5 being the area shown in cross-hatching. Address lines 7 and 8 have not been shown for the sake of simplicity. Field plate 5 serves two main purposes. First, if field plate 5 is opaque to incident radiation, as it typically will be, it prevents the incident radiation from generating carriers in the regions between the detection regions of the capacitors 10. Second, field plate 5 is normally slightly positively biased so that the surface of the substrate 1 beneath field plate 5 is in accumulation. So biased, field plate 5 forms a channel stop between detection areas and thereby isolates each detection area from the others by preventing carriers from one detection area from migrating to another. FIG. 3 also shows one detection region 13 of one capacitor 10 having an opaque field plate 5 and illustrates how this area 13 is isolated from the other capacitors 10 of FIG. 3.

As discussed earlier, an edge field enhancement effect is observed at the edge of potential well 11 regardless of whether the field plate 5 is positively biased, electrically connected to the substrate 1, or negatively biased at the flatband voltage. This edge field enhancement may be viewed as resulting from the abruptness with which the potential at the edge of well 11 drops from its maximum potential. A comparison of the gradient of the well potential at the two points A and B of FIG. 2 provides one basis for understanding the edge field enhancement effect. The potential gradient observed at the point A of FIG. 2 is much greater than the potential gradient observed at point B of FIG. 2. Consequently, the electric field observed at the point A at the edge of well 11 is significantly larger than the electric field at point B.

This enhancement of the electric field observed at the edge of well 11 serves to limit the injection voltage which can be effectively applied to gate address line 7 and consequently limits the amount of signal charge which can be detected. If the field plate 5 is biased positively so that the substrate surface beneath it is in accumulation, the electric field at the well edge is of even greater intensity than the electric field produced when the field plate 5 is tied to the substrate or slightly negatively biased. A decrease in the intensity of the electric field at the edge of well 11 may be obtained by applying a slight negative bias to field plate 5. However, the amount of decrease attainable is limited by the fact that if the field plate 5 is to serve as a channel stop or achieve an isolating function it must be biased more positively than the flatband voltage. Otherwise surface inversion results and the field plate 5 fails to properly isolate one detection area from another. It should be noted that the above discussion is for a substrate 1 which is assumed to consist of n-type material. The basic discussion holds true for a p-type substrate but the signs for the biases applied must be reversed, for example, negative bias must be changed to positive bias.

The present invention allows a significant reduction in the edge field enhancement effect without requiring any substantial increase in the complexity of device fabrication. Devices according to the present invention can be fabricated using planar fabrication techniques. Consequently, the present invention achieves an increased well capacity and dynamic range at little increased cost.

FIG. 4 illustrates one embodiment of apparatus according to the present invention. An improved MIS capacitor 20 suitable for connection into various arrays of devices includes a semiconductor substrate 21, first insulating layer 22 overlying the substrate 21, a gate 23 fabricated on the upper surface of insulating layer 22, and a field plate 25 fabricated on the upper surface of insulating layer 22 (and thus coplanar with gate 23) with its inner edge spaced from the outer edge of gate 23. A second insulating layer 24 overlies first insulating layer 22, gate 23 and field plate 25. A buffer gate 27 is fabricated on second insulating layer 24 and overlaps gate 23 and field plate 25. A third insulating layer 26 overlies buffer gate 27 and second insulating layer 24. A gate address line 28, shown schematically, connects gate 23 to an external terminal where bias potential can be applied. A field plate address line 29, shown schematically, connects field plate 25 to an external terminal, and a buffer gate address line 30, shown schematically, connects buffer gate 27 to an external terminal. By providing the buffer gate 27 and biasing that gate at a potential exceeding the flatband potential a substantial reduction in edge field enhancement effect is obtained.

FIG. 5 depicts how this reduction in edge field enhancement is achieved. Rather than an abrupt change in well potential at the well edge, it is seen that a gradual step down change occurs as the biased buffer gate 27 creates a buffered zone 35 with lower potential gradients between the areas of the substrate under the gate 23 and field plate 25. By adjusting the area of the buffer gate 27 and the distance between gate 23 and field plate 25, designated d in FIG. 4, the well capacity of buffered zone 35 may be kept small enough so that substantially all the charge stored by capacitor 20 is stored beneath gate 23 and any charge stored in buffered zone 35 does not seriously affect the operation of the device 20. It has been found that suitable performance is achieved with ratios of the areas of the gate 23 and the buffer gate 27 ranging from 5:1 to 20:1. The distance d separating gate 23 and field plate 25 will have a maximum length determined by the quality of the material used for substrate 21 and a minimum length determined by the resolution achievable with the fabrication process used. A distance d of a few microns has been found satisfactory.

For a substrate 21 of indium antimonide (InSb), insulating layers 22, 24 and 26 of silicon dioxide ($SiO_2$), field plate 25, buffer gate 27 and gate 23, of chromium (Cr); it was found that the maximum injection voltage which could be applied to gate 23 was roughly double that which could be applied without the appropriately biased buffer gate 27. With a buffer gate 27 biased at −4 volts, it was found that the maximum injection voltage on gate 23 could be increased by 2.5 volts or more for example, from −6 volts to −8.5 volts with a corresponding increase in well capacity observed. The maximum injection voltage for an MIS capacitor similar to that shown in FIG. 1 but fabricated from InSb, SiO$_2$ and Cr is approximately 1 volt.

FIG. 6 helps to illustrate the spatial arrangement of the field plate 25, the buffer gate 27 and gate 23 of capacitor 20 of FIG. 4. From FIG. 4, it is seen that the field plate 25 and the gate 23 are coplanar and that the field plate 25 is spaced from the gate 23. In FIG. 6, the field plate 25 covers the area between the outer boundary 41 to the dash-and-dot line 42 and gate 23 is the area within the short-dash line 43. Thus, it is seen from FIG. 6 that field plate 25 entirely surrounds gate 23. FIG. 4 shows buffer gate 27 as lying above and overlapping the gate 23 and the field plate 25. It should be noted that while FIG. 4 shows buffer gate 27 as overlapping field plate 25, in some embodiments buffer gate 27 will not overlap field plate 25. In FIG. 6, the buffer gate 27 covers the area between the long-dash lines 44 and 45.

FIG. 6 also shows one way in which gate address line 28 and buffer gate address line 30 can be connected to the gate 23 and the buffer gate 27 respectively. In FIG. 6 gate address line 28 consists of a metalization line 28A on the surface of insulating layer 24 which runs from the edge of capacitor 20 to a contact window or via 28B through which a contact to gate 23 is made. Buffer gate address line 30 consists of a metalization line on the surface of insulating layer 26 which runs from the edge of capacitor 20 directly to the buffer gate 27. Other methods of providing a gate address line and a buffer gate address line are well known. For simplicity, FIG. 6 does not show the field plate address line 29 of FIG. 4. In some embodiments, the field plate 25 will not be connected to an independent supply of bias voltage but will instead be tied to the substrate 21 by such means as a wire bond or by way of a via through the insulating layer 22.

FIG. 7 illustrates a second embodiment of the present invention as applied to an MIS capacitor 200 which is suitable for incorporation into various arrays of devices. Capacitor 200 is constructed very similarly to capacitor 20 with the parts 201-205 and 207 of FIG. 7 corresponding to the parts 21-25 and 27 of FIG. 4. The embodiment of FIG. 7 differs from that shown in FIG. 4 in that MIS capacitor 200 has only a single address line 208 shown schematically in FIG. 7 for both the gate 203 and the buffer gate 207, it lacks an insulating layer corresponding to insulating layer 26, and a field plate address line is not shown. In this embodiment, either a separate field plate address line might be provided or the field plate 205 might be connected to substrate 201 using the means discussed above for connecting field plate 25 to substrate 21. With a single biasing potential applied on address line 208, capacitor 200 achieves the same edge field enhancement reduction as achieved by capacitor 20 if the thickness of the second insulating layer 204, shown in FIG. 7 as t$_{204}$, is appropriately determined. For an MIS capacitor 200 constructed of InSb, SiO$_2$ and Cr with an insulating layer 202 of 1500Å thickness, an insulating layer 204 having a thickness t$_{204}$ of 8000Å has been found to be acceptable. As is the case for capacitor 20 of FIGS. 4-6, the area of gate 203 is much larger than the area of buffer gate 207 with a ratio of these areas from 5:1 to 20:1 having been found to be suitable.

FIG. 8 follows the same boundary line convention as FIG. 6 with the field plate 205 consisting of the area between outer boundary 401 and dash-and-dot line 402, the gate 203 lying within short-dash line 403, and buffer gate 207 lying between a pair of long-dash lines 404 and 405. FIG. 8 also shows the sole address line 208 which provides means to address both the gate 203 and the buffer gate 207. Address line 208 consists of a metalization line 208A which runs from the edge of capacitor 200 to the outer edge of buffer gate 207 and from the inner edge of buffer gate 207 to and through via 208B to contact gate 203. From a comparison of FIGS. 6 and 8, it is seen that the second embodiment is simpler to fabricate.

Figure 10:
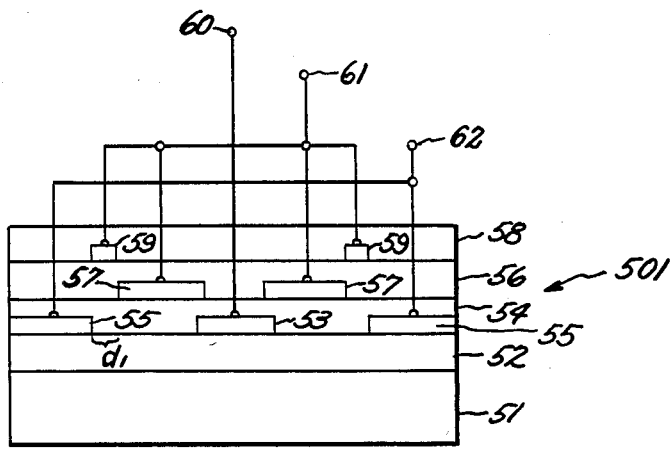
FIG. 10 is a cross-sectional side view of a single picture element of FIG. 9.
Figure 11:
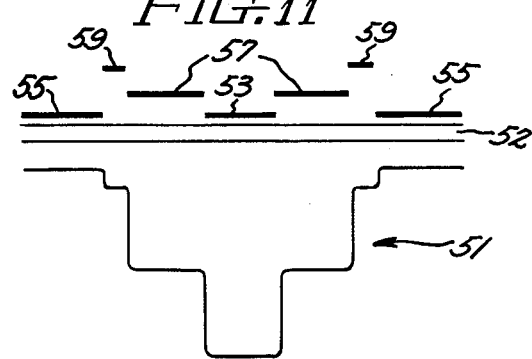
FIG. 11 is a schematic illustration of the picture element of FIG. 10 and depicts the wells which will form in the substrate of the picture element when all the electrodes of that picture element are biased.

FIGS. 9, 10 and 11 illustrate the preferred embodiment of the present invention applied in the context of a rectangular array of detection centers or picture elements. FIG. 9 shows a two-by-two portion of a rectangular array 500. The shown portion of array 500 consists of four picture elements 501-504. Picture elements 502-504 are shown in block form and picture element 501 which is representative of the other elements is shown in detail.

FIG. 10 shows a cross-sectional view of picture element 501 of FIG. 9. The picture element 501 has two gate electrodes, a column gate electrode 53 and a row gate electrode 57, which are used for selectively reading out charge stored by picture element 501. Picture element 501 comprises substrate 51, first insulating layer 52, column gate 53 and field plate 55, second insulating layer 54, row gate 57, third insulating layer 56, buffer gate 59, and fourth insulating layer 58. FIG. 10 also shows combined row and buffer gate address line 61, column gate address line 60, and field plate address line 62. The address lines 60, 61 and 62 of FIG. 10 are all shown schematically. As an alternative to the address line arrangement shown in FIG. 10, the field plate address line 62 might be eliminated and the field plate might be connected to the substrate 51 as discussed above for devices 20 and 200.

The top view of picture element 501 shown in FIG. 9 illustrates the spatial arrangement of the gates 53, 57 and 59 and field plate 55. FIG. 9 also schematically shows address lines 60 and 61. Address line 60 connects to column gate 53 by means of via 520. Address line 61 connects to row gate 57 and buffer gate 59 using known means. Line 510 of FIG. 9 represents the inner edge of row gate 57, line 511 represents the outer edge of column gate 53, line 512 represents the inner edge of buffer gate 59, line 513 represents the outer edge of row gate 57, line 514 represents the inner edge of field plate 55 and line 515 represents the outer edge of buffer gate 59. Buffer gate 59 is shown as overlapping and overlying both the field plate 55 and row gate 57 though in other embodiments it may not overlap field plate 55. It has been found that the areas of the column gate 53 and row gate 57 should be made roughly equal so that charge stored beneath column gate 53 may be transferred and stored beneath row gate 57 and vice versa, though for certain applications the ratio of the areas may be varied. As is the case for the embodiments of FIGS. 4-6 and FIGS. 7 and 8, the area of the buffer gate 59 should be substantially smaller than the area of the gate, here row gate 57, which it is buffering. Ratios for the area of the row gate 57 and the buffer gate 59 ranging from 5:1 to 20:1 have been found suitable. Distance d$_1$ of FIG. 10 is the distance between the inner edge of field plate 55 and the projection of the outer edge of row gate 57 down to the same level that field plate 55 is on. The distance d$_1$ will typically be on the order of several microns. The minimum distance $d_1$ is determined by the resolution of the fabrication technique and the maximum distance $d_1$ is determined by the quality of the material of substrate 51 and the dark current characteristic of substrate 51. Typically, distance $d_1$ is made small so that the sizes of the buffer gate 59 and the picture element 501 are minimized and only a small amount of charge relative to the amount stored under the row gate 57 can be stored under the buffer gate 59.

FIG. 11 depicts the potential wells in the substrate 51 when the column gate 53, row gate 57 and buffer gate 59 all have a biasing voltage applied. The bias on buffer gate 59 results in the formation of a buffered zone providing a gradual potential step down at the edge of the potential well beneath row gate 57 thus allowing the maximum injection voltage on row gate 57 to be increased which in turn allows the maximum injection voltage on the column gate 53 to be increased.

The techniques for incorporating the method and apparatus of the present invention into a detection or sensing system are known to persons skilled in the art. Also, the application of the method of the invention to the reduction of the edge field effect in devices other than the particular CIDs described will be understood from the present disclosure. For example, the present invention might be applied to a device not having a field plate or having the same parts with a different spatial arrangement, for example, a buffer gate might underlap rather than overlap. Finally, a projection of the outer perimeter of a buffer gate onto the level of the gate being buffered need not entirely surround the gate being buffered so long as an effective buffered zone is created in the substrate wherever it is needed in order to reduce the edge field enhancement effect.

From the foregoing, it will be appreciated that the method and apparatus of our invention can be used in infrared imaging systems having increased dynamic range. Devices according to our invention which have a buffer gate buffering a gate electrode achieve the advantages of reduced edge field enhancement and increased maximum injection voltage. It can also be appreciated that the above advantages may be achieved by devices according to our invention which are fabricated using planar fabrication techniques.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

We claim:

1. A method of reducing edge field enhancement at an edge of a potential well during a detection interval wherein during said detection interval said potential well receives incident radiation, said potential well being in a first portion of a semiconductor substrate lying beneath a biased gate electrode of a layered metal-insulator-semiconductor device having a radiation-transparent gate electrode formed on a first layer of the device and a buffer gate at a different layer of the device than the layer upon which the gate electrode is formed, said buffer gate positioned to partially overlap the biased gate electrode and overlie the entire peripheral edge of the potential well comprising the step of preparing the semiconductor substrate to receive radiation by biasing the buffer gate above the flatband voltage with a non-zero bias potential only during said detection interval simultaneous with the biasing of the gate electrode so that a buffer zone is created in a second portion of the semiconductor substrate adjoining and entirely surrounding the potential well and lying beneath the buffer gate.

2. A method of increasing the maximum injection voltage which may be applied to a radiation-transparent gate electrode of a layered charge injection device having a buffer gate at a different layer of the device than the layer upon which the gate electrode is formed, said gate electrode overlying a potential well in a said charge injection device formed when said gate electrode is biased, and said buffer gate being positioned to partially overlap the gate electrode around the entire periphery of the gate electrode and overlying the entire peripheral edge of the potential well, comprising the step of only simultaneously with biasing the gate electrode, biasing the buffer gate above the flatband voltage with a non-zero bias potential to reduce the edge field along the entire peripheral edge of the potential well.

3. The method of claims 1 or 2 wherein the ratio of gate electrode area to buffer gate area is substantially larger than 1:1.

4. The method of claim 3 wherein the ratio of gate electrode area to buffer gate area is at least 5:1.

5. The method of claim 3 wherein a line defined by the projection of the outer perimeter of the buffer gate onto the layer upon which the gate electrode is formed surrounds the gate electrode.

6. The method of claim 5 further comprising the step of forming a field plate on the same layer as the gate electrode, the field plate being spaced from and surrounding the gate electrode.

7. The method of claim 6 wherein the field plate is formed so as to partially underlap the buffer gate.

8. An improved metal-insulator-semiconductor device comprising a substrate of semiconductor material, a first insulation layer overlying the substrate, a radiation-transparent gate electrode overlying a first portion of the first insulation layer and a first portion of the substrate in which a potential well is formed when the gate electrode is biased, means to isolate said first portion of the substrate which underlines the gate electrode, and a second insulation layer overlying the gate electrode and the first insulation layer; wherein the improvement comprises a buffer gate overlying a portion of the second insulation layer, partially overlapping the gate electrode around the entire periphery of the gate electrode, and overlying the entire periphery of the potential well and means biasing said buffer gate with a non-zero bias potential only when a bias is applied to said gate electrode whereby a buffer zone is created in a second portion of the substrate underlying the buffer gate when a voltage exceeding the flatband voltage is applied to the buffer gate, said second portion of the substrate adjoining the first portion of the substrate and lying between the first portion of the substrate and a third portion of the substrate which underlies the means for isolating the gate electrode, said buffer zone resulting in a reduced edge field enhancement.

9. The apparatus of claim 8 wherein a projection of the outer perimeter of the buffer gate onto the first insulation layer surrounds the gate electrode.

10. The apparatus of claim 9 further comprising means to bias the buffer gate at a voltage exceeding the flatband voltage when a bias is applied to the gate electrode.

11. The apparatus of claim 10 wherein the means to bias the buffer gate comprises a buffer gate address line connected to the buffer gate.

12. The apparatus of claim 11 wherein the means for isolating the gate electrode comprises a field plate spaced from the gate electrode.

13. The apparatus of claim 12 wherein the field plate overlies a second portion of the first insulation layer and surrounds the gate electrode.

14. The apparatus of claim 13 wherein the field plate partially underlaps the buffer gate.

15. The apparatus of claims 8, 9, 10, 11, 12, 13 or 14 wherein the ratio of gate electrode area to buffer gate area is substantially larger than 1:1 so that an amount of charge insubstantial in relation to the charge stored beneath the gate electrode is stored in the second portion of the substrate during operation of the improved metal-insulator-semiconductor device.

16. The apparatus of claim 15 wherein the ratio of gate electrode area to buffer gate area is at least 5:1.

17. The apparatus of claim 11 further comprising a gate electrode address line which is electrically connected bo the buffer gate address line and wherein any of the plurality of insulation layers between the buffer gate and the substrate have a predetermined thickness.

18. An improved charge injection device comprising a substrate of a semiconductor material, a first insulation layer overlying the substrate, a radiation-transparent gate electrode overlying a first portion of the first insulation layer and a portion of the substrate in which a potential well is formed when the gate electrode is biased, said gate electrode having an outer edge, a field plate coplanar with the gate electrode, overlying a second portion of the first insulation layer, said field plate having an inner edge spaced from the outer edge of the gate electrode so that an area of separation between the gate electrode and the field plate exists, the gate electrode and the field plate being positioned with respect to each other so that the area of separation between them is substantially smaller than the area of the gate electrode, a second insulation layer overlying the first insulation layer, the gate electrode and the field plate, and a buffer gate overlying the second insulation layer and at least a portion of the area of separation between the gate electrode and the field plate, slightly overlapping the entire outer edge of the gate electrode, and overlying the entire periphery of the potential well, means for applying a non-zero bias voltage to said buffer gate only simultaneous with the biasing of said radiation transparent gate electrode whereby the maximum injection voltage of the improved charge injection device is increased when the buffer gate is biased with a non-zero potential beyond the flatband voltage only at the same time the gate electrode is based.

19. The apparatus of claim 18 wherein the field plate surrounds the gate electrode.

20. The apparatus of claim 18 wherein a line defined by the projection of the outer perimeter of the buffer gate onto the first insulation layer surrounds the gate electrode.

21. The apparatus of claim 18 further comprising a gate electrode address line connected to the gate electrode.

22. The apparatus of claim 21 further comprising a buffer gate address line connected to the buffer gate.

23. The apparatus of claim 22 wherein the buffer gate address line is connected to the gate electrode address line and the first and second insulation layers have predetermined thickness.

24. The apparatus of claim 18 wherein the field plate is connected to the substrate.

25. The apparatus of claim 18 further comprising a field plate address line.

26. The apparatus of claim 18 wherein the field plate partially underlaps the buffer gate.

27. The apparatus of claim 18 wherein the substrate consists of a narrow band gap semiconductor material.

28. The apparatus of claims 18, 19, 20, 21, 22, 23, 24, 25, 26 or 27 wherein the ratio of gate electrode area to buffer gate area is at least 5:1.

29. An improved charge injection device suitable for use in an infrared imaging system having a plurality of charge injection devices fabricated in a common substrate, said improved charge injection device comprising a substrate of semiconductor material; a first insulation layer overlying the substrate; a column gate electrode overlying a first portion of the first insulation layer, said column gate electrode having an outer edge; a field plate overlying a second portion of the first insulation layer, said field plate having an inner edge spaced from the outer edge of the column gate; a second insulation layer; a radiation-transparent row gate electrode overlying a portion of the second insulation layer, said row gate electrode having an outer edge; a third insulation layer; said column and row gate electrode overlying a portion of the substrate in which a potential well is formed when said electrodes are biased; a buffer gate overlying a portion of the third insulation layer and the entire periphery of the potential well, said buffer gate having an inner edge which overlaps the entire outer edge of the row gate electrode and means for biasing said buffer gate with a non-zero bias potential only when either of said row or column gate electrodes is biased.

30. The apparatus of claim 29 wherein the second insulation layer overlies the first insulation layer, the gate electrode and the field plate.

31. The apparatus of claim 30 wherein the third insulation layer overlies the second insulation layer and the row gate electrode.

32. The apparatus of claim 29 wherein the field plate surrounds the column gate.

33. The apparatus of claim 29 wherein a line defined by the projection of the outer perimeter of the buffer gate onto the second insulation layer surrounds the row gate.

34. The apparatus of claim 29 wherein the field plate underlaps the buffer gate.

35. The apparatus of claim 29 further comprising a buffer gate address line connected to the buffer gate.

36. The apparatus of claim 35 further comprising a row gate address line connected to the row gate and the buffer gate address line.

37. The apparatus of claim 29 wherein the field plate is connected to the substrate.

38. The apparatus of claim 29 further comprising a field plate address line connected to the field plate.

39. The apparatus of claims 29, 30, 31, 32, 33, 34, 35, 36, 37 or 38 wherein the column gate electrode has an area A, the row gate electrode has an area B and the buffer gate electrode has an area C, the ratio of the areas A and B being roughly equal to 1:1 so that any charge stored beneath the column gate electrode may be transferred and stored beneath the row gate electrode and vice versa, and the ratio of the areas A or B and C is substantially greater than 1:1 so that an amount of charge insubstantial in relation to the charge stored beneath the column gate or row gate can be stored beneath the buffer gate.

40. The apparatus of claim 39 wherein the ratio of the areas A or B and C is at least 5:1.

41. The apparatus of claim 39 wherein the ratio of the areas B and C is at least 5:1.

* * * * *